(12) United States Patent
Vareesantichai et al.

(10) Patent No.: US 10,249,556 B1
(45) Date of Patent: Apr. 2, 2019

(54) LEAD FRAME WITH PARTIALLY-ETCHED CONNECTING BAR

(71) Applicant: NXP B.V., Eindhoven (NL)

(72) Inventors: Verapath Vareesantichai, Bangkok (TH); Amornthep Saiyajitara, Bangkok (TH); Pimpa Boonyatee, Bangkok (TH); Adrianus Buijsman, Nijmegen (NL)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/913,855

(22) Filed: Mar. 6, 2018

(51) Int. Cl.
  *H01L 23/495* (2006.01)
  *H01L 23/482* (2006.01)

(52) U.S. Cl.
  CPC ...... *H01L 23/4951* (2013.01); *H01L 23/4824* (2013.01); *H01L 23/49548* (2013.01)

(58) Field of Classification Search
  CPC .................. H01L 23/4824; H01L 23/49548
  USPC .................................. 257/666, 676
  See application file for complete search history.

(56) References Cited

U.S. PATENT DOCUMENTS

| | | | |
|---|---|---|---|
| 5,258,331 A * | 11/1993 | Masumoto | H01L 21/4839 257/E23.049 |
| 5,789,280 A | 8/1998 | Yokota | |
| 6,424,024 B1 | 7/2002 | Shih et al. | |
| 6,489,218 B1 | 12/2002 | Kim et al. | |
| 6,608,366 B1 | 8/2003 | Fogelson | |
| 6,674,156 B1 | 1/2004 | Bayan et al. | |
| 6,885,086 B1 | 4/2005 | Fogelson | |
| 8,368,192 B1 * | 2/2013 | Chen | H01L 23/49531 257/676 |
| 8,853,836 B1 * | 10/2014 | Glenn | H01L 21/4842 257/666 |
| 9,324,642 B2 | 4/2016 | Puschner et al. | |
| 2003/0178707 A1 | 9/2003 | Abbott | |
| 2006/0208344 A1 | 9/2006 | Shiu et al. | |
| 2007/0284392 A1 * | 12/2007 | Kaess | B65D 47/0804 222/153.05 |
| 2008/0157401 A1 * | 7/2008 | Kim | H01L 23/49551 257/787 |
| 2011/0089556 A1 * | 4/2011 | Lee | H01L 23/49503 257/692 |
| 2011/0111562 A1 | 5/2011 | San Antonio et al. | |
| 2011/0263077 A1 | 10/2011 | Bai et al. | |
| 2012/0030065 A1 | 2/2012 | Tarvydas et al. | |
| 2014/0145318 A1 * | 5/2014 | Otremba | H01L 23/49562 257/670 |

(Continued)

*Primary Examiner* — Nitin Parekh
(74) *Attorney, Agent, or Firm* — Charles E. Bergere

(57) ABSTRACT

A lead frame strip includes an array of lead frames. The lead frames each include a die pad and lead fingers that are spaced from the die pads and disposed along one or more sides of the die pads. The lead fingers have proximal ends near to the die pad and distal ends farther from the die pad. Connection bars extend between the lead frames. The lead fingers of adjacent lead frames extend from opposing sides of the connection bars. The connection bars have first portions where the lead fingers are connected thereto, and second portions between adjacent lead finger connections to the connection bar. The second portions are etched to form a bar that extends diagonally from a first one of the adjacent lead fingers connected thereto to a second one of the adjacent lead fingers connected thereto.

18 Claims, 4 Drawing Sheets

(56) References Cited

U.S. PATENT DOCUMENTS

2014/0327122 A1* 11/2014 Jeon ................ H01L 24/97
257/670
2015/0371933 A1* 12/2015 Jeon ............ H01L 23/49548
257/669

* cited by examiner

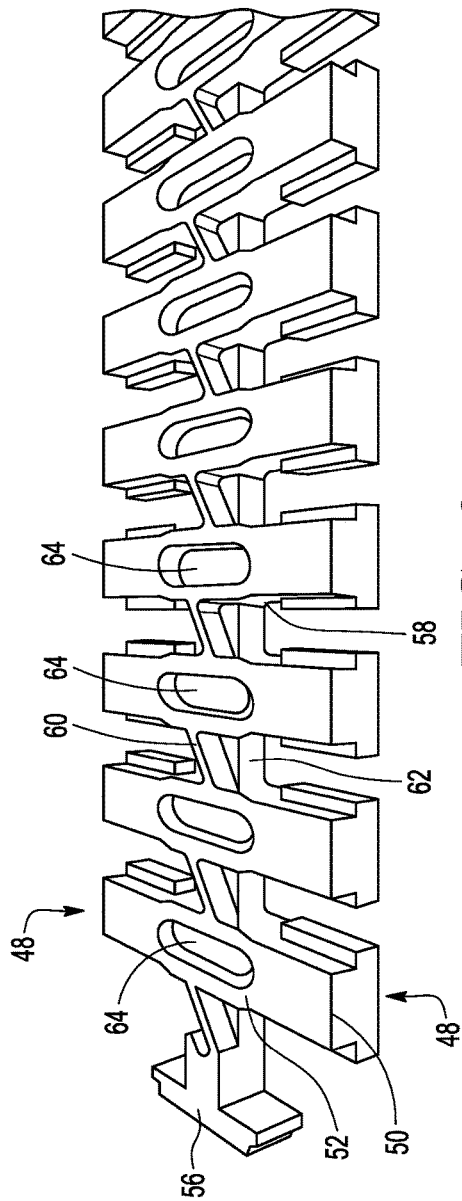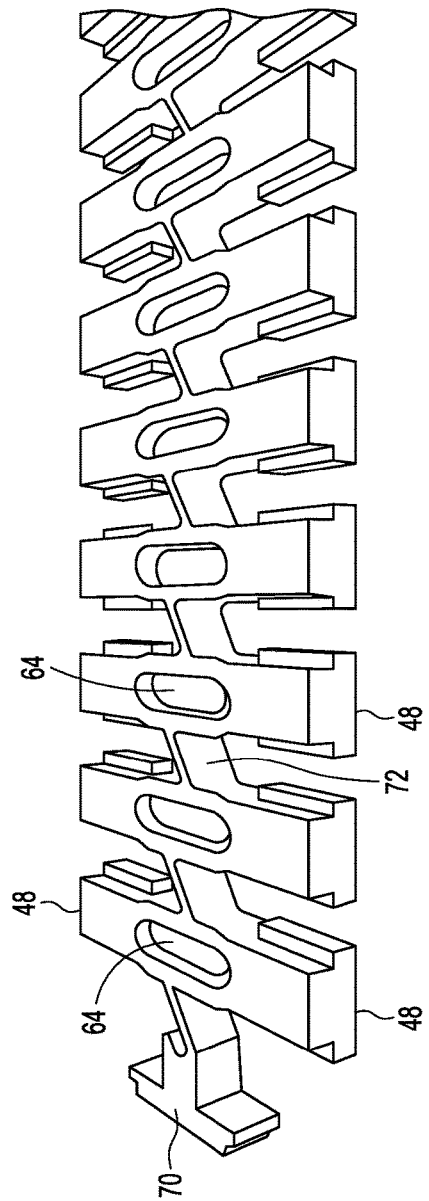

LEAD FRAME WITH PARTIALLY-ETCHED CONNECTING BAR

BACKGROUND

The present invention generally relates to semiconductor devices, and, more particularly, to lead frames used to assemble semiconductor devices.

Leaded semiconductor devices have leads that extend from a main package body. Non-leaded devices, such as Quad Flat No-leads (QFN) devices, are similar to leaded semiconductor devices except that the leads do not extend outwardly or project from the package body. Rather, the leads are generally flush with the package body. Both leaded and non-leaded devices are assembled using lead frames. Lead frames are metal frames that typically include a die mounting pad (i.e., a die pad or die flag), and a plurality of leads that surround the die pad. Lead frames are provided in strip or array form so that many devices may be assembled simultaneously.

FIG. 1 shows a portion of a lead frame array 10, where two lead frames 12 are shown. The lead frames 12 include central die pads 14 that are rectangular in shape. Leads 16 are provided along two of the opposing sides of the die pads 14. The leads 16 that are located between the die pads 14 of the two lead frames 12 are joined by a connection bar 20, or put another way, the leads 16 project outwardly from the connection bar 20 that extends between the two lead frames 12. After semiconductor dies (outlies of the dies are shown in dashed lines) are attached to the die pads 14 and electrically connected to the leads 16, either before or after a molding process in which the dies and electrical connections are covered with a molding compound, the assembled devices are separated by cutting along the connection bar 20. Because the connection bar 20 is made of metal, there is considerable wear on the saw blades used to singulate the assembled devices.

FIG. 2 is an enlarged view of a portion of a connection bar 20 with leads 22 extending outwardly from two opposing sides thereof. The connection bar 20 has been etched so that it is thinner than the leads 22, making it easier to saw and allowing for less wear on the saw blade. However, etching of the connection bar 20 also weakens the connection bar 20 such that it is susceptible to bending, as shown in the circled portion of FIG. 3. This bending moves the leads 22, which can cause lead shorting and/or wire bonding issues. Accordingly, it would be advantageous to have a lead frame that is strong, yet allows for a long saw blade life.

BRIEF DESCRIPTION OF THE DRAWINGS

So that the manner in which the features of the present invention can be understood in detail, a detailed description of the invention is provided below with reference to embodiments, some of which are illustrated in the appended drawings. It is to be noted that the appended drawings illustrate only typical embodiments of the invention and are therefore not to be considered limiting of its scope, for the invention may admit to other equally effective embodiments. The drawings are for facilitating an understanding of the invention and thus are not necessarily drawn to scale, and some features may be omitted in order to highlight other features of the invention so that the invention may be more clearly understood. Advantages of the subject matter claimed will become apparent to those skilled in the art upon reading this description in conjunction with the accompanying drawings, in which like reference numerals have been used to designate like elements, and in which:

FIG. 6 is a perspective view illustrating a connection bar of the lead frame strip shown in FIG. 4; and FIG. 7 is a perspective view illustrating a connection bar of a lead frame strip in accordance with an alternative embodiment of the present invention.

DETAILED DESCRIPTION

In one embodiment, the present invention provides a lead frame for semiconductor device assembly. The lead frame comprises a die pad for receiving an integrated circuit (IC) die, and a plurality of lead fingers disposed along at least two opposing sides of the die pad. Each of the lead fingers has a proximal end near to the die pad and a distal end farther from the die pad. The lead fingers are generally perpendicular to side of the die pad along which they are located. There are connection bars extending parallel to the respective opposing sides of the die pad, with the distal ends of the lead fingers on that side being connected to the connection bar. The connection bars have first portions where the lead fingers are connected thereto, and second portions between adjacent lead finger connections to the connection bar. The second portions comprise a bar that extends diagonally from a first one of the adjacent lead fingers connected thereto to a second one of the adjacent lead fingers connected thereto.

In another embodiment, the lead frame is part of a strip of similar lead frames, where connection bars are shared by adjacent lead frames.

In yet another embodiment, the present invention provides a method of simultaneously assembling a plurality of semiconductor devices, including the steps of attaching integrated circuit dies die pad of lead frames of a lead frame strip, as described above, electrically connecting the integrated circuit dies to the proximal ends of respective ones of the leads of the respective lead frames, covering the dies and the electrical connections with a molding compound, thereby forming assembled devices; and separating the assembled devices by cutting along the connection bars, thereby separating adjacent, simultaneously formed semiconductor devices.

Figure 1:
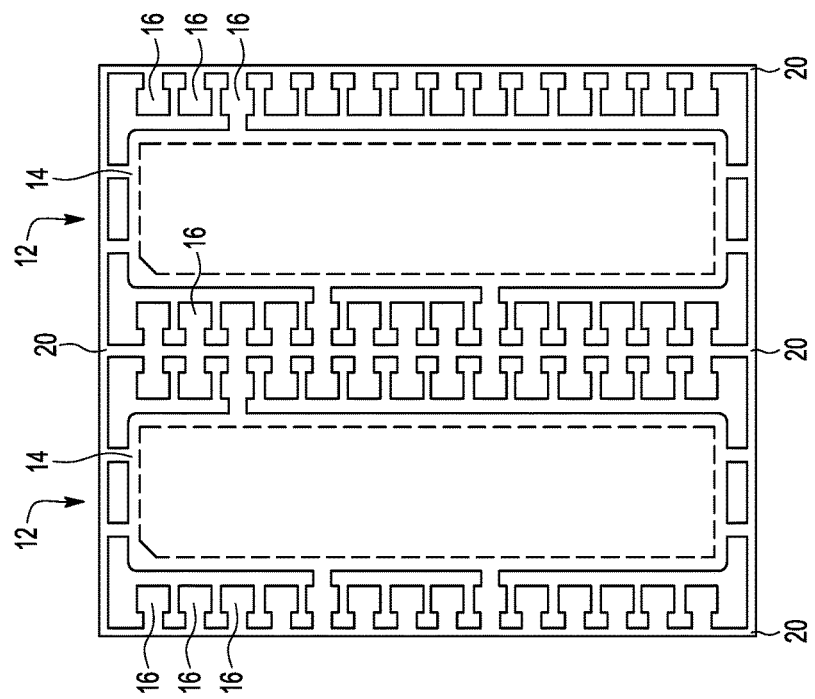
FIG. 1 is an enlarged top plan view of a portion of a conventional lead frame strip, showing two lead frames thereof.
Figure 2:
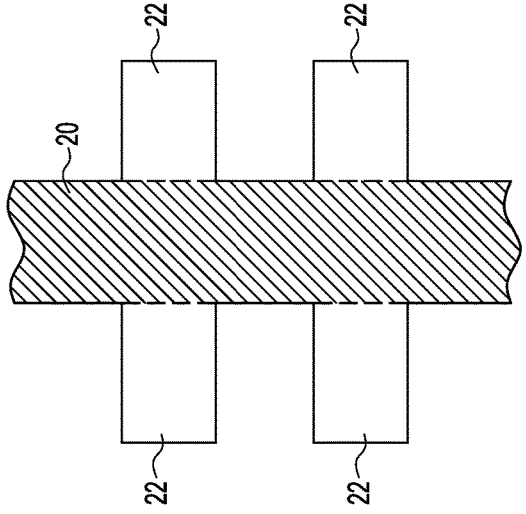
FIG. 2 is a greatly enlarged top plan view of a portion of a conventional lead frame strip illustrating an etched connection bar thereof.
Figure 3:
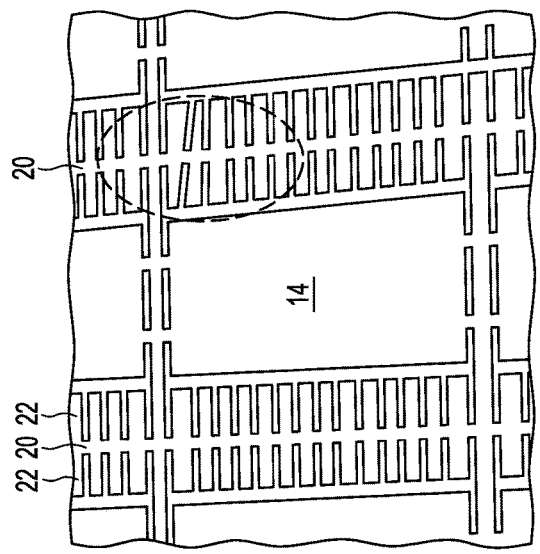
FIG. 3 is a greatly enlarged top plan view of a portion of the conventional lead frame strip of FIG. 2, illustrating bending of one of the connection bars thereof.
Figure 4:
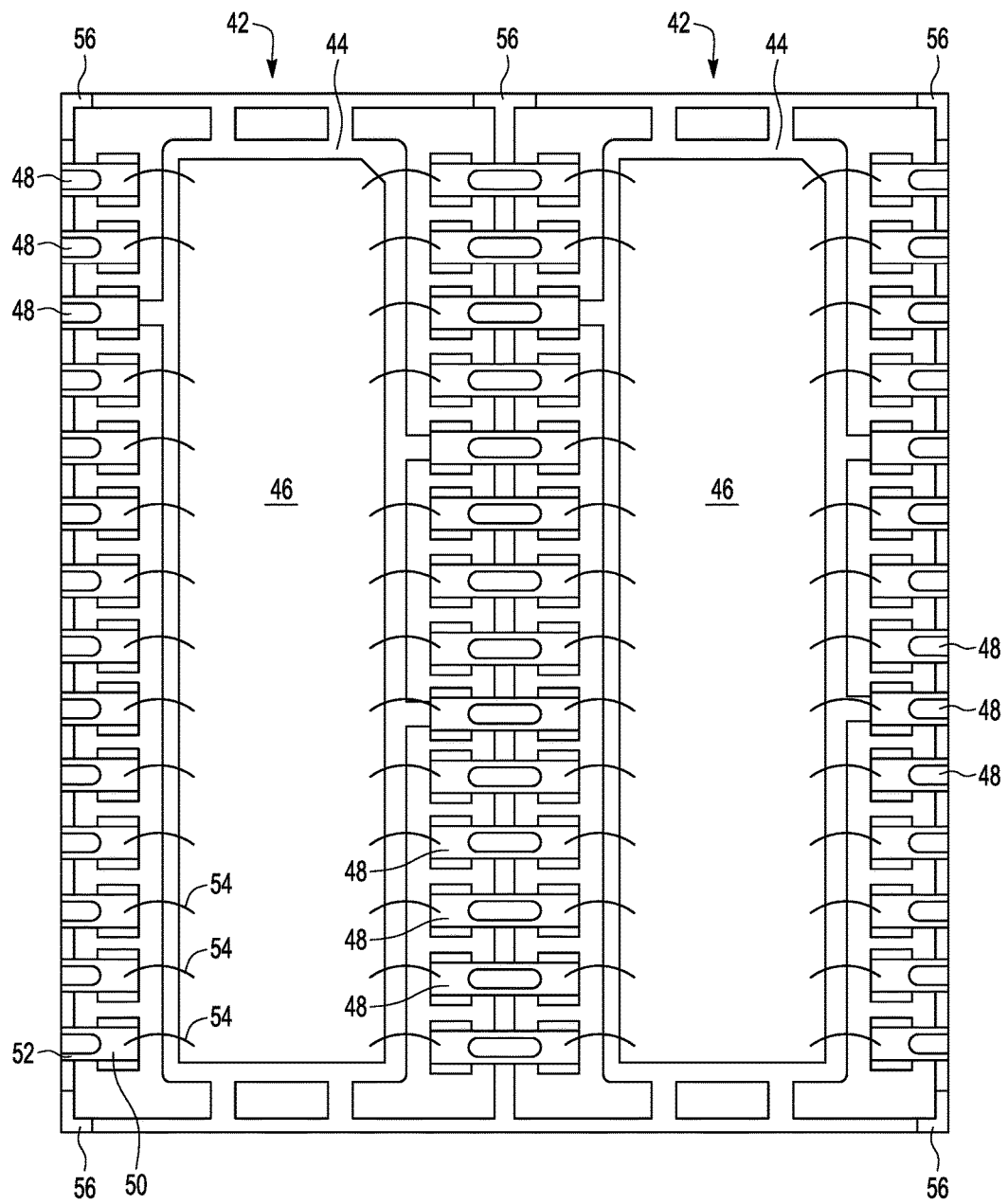
FIG. 4 is an enlarged is top plan of two partially assembled semiconductor devices formed on adjacent lead frames of a lead frame strip of the present invention.

Referring now to FIG. 4, a portion of a lead frame strip 40 including an array of lead frames 42, two of which are shown, is shown. The lead frame strip 40 may comprise copper or copper foil and may be plated, partially plated, or bare copper. That is, as discussed below, lead fingers of the lead frames 40 may be plated with a metal or metal alloy, such as Nickel and/or Palladium. The lead frame strip 40 is of a type well known in the art, so detailed description of those elements of the lead frame strip that are not particularly pertinent to understanding of the present invention will not be described, so as not to obscure the invention. The lead frame strip 40 is used to assemble integrated circuit devices, and FIG. 4 shows two such partially assembled devices, as described below.

Each lead frame 42 includes a die pad 44 for receiving an integrated circuit (IC) die 46. The die pad 44 typically is sized and shaped to receive the die 46, i.e., based on the size and shape of the die 46. However, the size and shape of the die pad 44, and the size and type of die 46 are not part of the present invention, so will not be described in further detail herein.

The lead frames 42 also include a plurality of lead fingers 48. The lead fingers 48 are disposed along at least two opposing sides of the die pad, as shown in FIG. 4, although in some embodiments, the lead fingers 48 may be disposed along one, two, three, or all four sides of the die pads 44. In the embodiment shown in FIG. 4, the leads are disposed along two opposing sides of the die pads 44. Each of the lead fingers 48 has a proximal end 50 near to the die pad 44, and a distal end 52 farther from the die pad 44, and the lead fingers 48 are extend in a direction perpendicular to the die pad 44. The integrated circuit die 46 is electrically connected to the lead fingers 48, and in the embodiment shown, the electrical connection is achieved with bond wires 54.

The lead frame strip 40 further comprises at least one connection bar 56 that extends parallel to at least one the sides of the die pad, and the distal ends 52 of the lead fingers 48 are connected to the connection bar 56. Put another way, the lead fingers 48 extend from the connection bar 56 towards the die pad 44.

Figure 5:
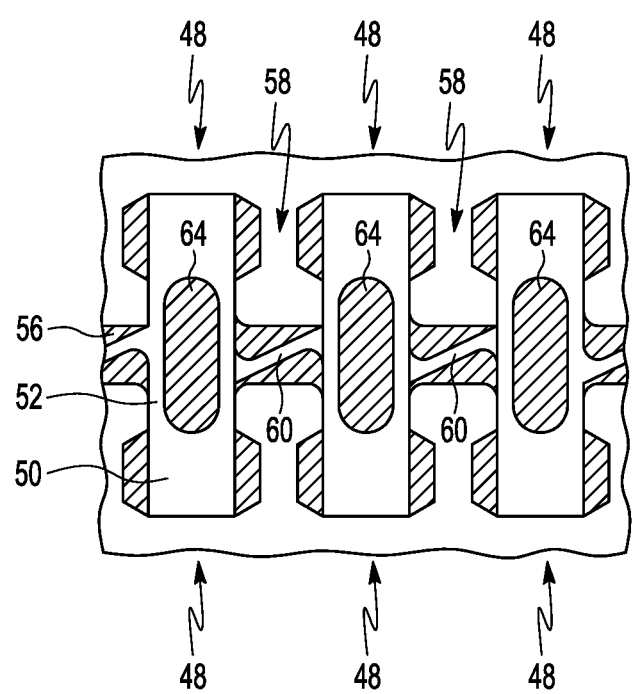
FIG. 5 is a top plan view of a portion of a connection bar and some leads extending therefrom in accordance with an embodiment of the present invention.

FIG. 5 is a top plan view of a portion of a connection bar 56 and some lead fingers 48 extending therefrom in accordance with an embodiment of the present invention. As shown, the lead fingers 48 extend from both sides of the connection bar 56, with the distal ends 50 of the lead fingers 48 being connected to the connection bar 56. Thus, the connection bars 56 have first portions where the lead fingers 48 are connected thereto and second portions 58 between adjacent lead finger connections to the connection bar 56. The second portions 58 comprise a bar 60 that extends diagonally from one lead finger 48 to an adjacent lead finger 48, and more particularly, extends diagonally from a distal end 52 of one lead finger 48 to the distal end 52 of the next lead finger 48 along the connection bar 56.

FIG. 6 is a perspective view illustrating the connection bar 56 of the lead frame strip 40 shown in FIG. 4. As can be seen in FIG. 6, the diagonal bar 60 has a depth or thickness that is equal to a depth or thickness of the lead fingers 48. The diagonal bars 60 may be formed by etching the connection bar 56. That is, initially the connection bar 56 is a uniform bar having a length that is a bit longer than a length of the die pad 44 (as shown in FIG. 4), a width that generally is less than or equal to a width of a saw blade used to cut away the connection bar 56 when separating adjacent simultaneously formed devices, and a depth or thickness that is the same as the lead fingers 48 and the die pad 44 (although it will be understood by those of skill in the art that in some cases the die pad 44 may be thicker or thinner depending on design parameters, e.g., for power dies the die pad may be relatively thick compared to the leads). The diagonal bar 60 then is formed by etching the second portion 58 of the connection bar 56.

FIG. 6 also shows that the second portions 58 further comprise a non-etched portion 62 that extends between the pairs of lead fingers 48 (a pair of lead fingers means lead fingers of adjacent lead frames that are connected to the same connection bar at the same place). Thus, the diagonal bar 60 is formed by etching away only a portion of the second portion 58 of the connection bar 56, such that between pairs of lead fingers, there is a non-etched portion 62 and a diagonal bar 60. The non-etched portion 62 has a thickness that is less than a thickness of the lead fingers 48, for example, the non-etched portions 62 may have a thickness that is about one-half of the thickness of the diagonal bar 60 or the lead fingers 48.

Referring to FIGS. 5 and 6, in some embodiments the first portions of the connection bars 56 include a cavity 64 that extends across the first portion thereof and into the distal ends 52 of the lead fingers 48 connected thereto. The cavity 64 may be formed by etching the distal ends 52 of the lead fingers 48 and the first portion of the connection bar 56. The purpose of the cavity 64 is to hold solder or make the lead wettable. In one embodiment, the cavity 64 has a depth that is less than about one-half of a thickness of the lead fingers 48.

FIG. 7 is a perspective view illustrating a connection bar 70 of a lead frame strip in accordance with an alternative embodiment of the present invention. The connection bar 70 is similar to the connection bar 56 (FIG. 6) and has leads 48 that are connected in pairs and extend perpendicular thereto. The difference between the connection bar 70 and the connection bar 56 is that the there is no non-etched portion (see FIG. 6, non-etched portion 62) at the second portion of the connection bar, i.e., at the portion of the connection bar 70 between the pairs of leads 48. In this embodiment, the second portion comprises only a diagonal bar 72 extending between the pairs of leads 48.

The connection bars 56 and 70 of the present invention, which include diagonal bars 60 or 72, have more strength than the conventional connection bars, which prevents bending of the connection bars and misalignment of the lead fingers during transportation and/or assembly of integrated circuit devices.

The lead frame strip 40 is used to assemble a plurality of semiconductor devices simultaneously. In an assembly operation, integrated circuit dies 46 (FIG. 4) are attached to respective die pads 44 of respective lead frames 42. Next, the dies 46 are electrically connected the lead fingers 48 with bond wires 54, where the proximal ends 50 of respective ones of the leads 48 receive one end of the bond wires 54. After wire bonding, the dies 46 and the electrical connections are covered with a molding compound (not shown), thereby forming assembled devices. The molding compound provides electrical and mechanical protection to the integrated circuit dies 46, the lead frames 42 and the electrical connections between the dies 46 and the lead fingers 48. In one embodiment, the molding compound comprises an epoxy-resin composition, for example a C-stage plastic material (Resite). The molding compound subsequently is cured to be physically hard, so that the die 46, the lead fingers 48, and the bond wires 54 covered by the molding compound are protected from potential environmental influences like moisture and dust, as well as mechanical damage. The molding compound may be formed over the dies 46 using known methods, such as transfer molding.

The assembled devices are then separated by cutting along the connection bars with a mechanical saw, thereby separating adjacent, simultaneously formed semiconductor devices. Since the saw cuts along the connection bars 56, and the second portions of the connection bars 56 have much of the metal thereof etched away, the saw blade has less metal to cut and therefore saw blade wear is reduced.

Since the first portions of the connection bars 56 include a cavity that extends across the first portion and into the distal ends of the lead fingers connected thereto, there is less metal here for the saw to cut too, which also reduces saw blade wear.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein.

Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A lead frame for semiconductor device assembly, the lead frame comprising:
    a die pad for receiving an integrated circuit (IC) die;
    a plurality of lead fingers disposed along at least two opposing sides of the die pad, wherein each of the plurality of lead fingers has a proximal end near to the die pad and a distal end farther from the die pad, and wherein the plurality of lead fingers are perpendicular to the opposing sides of the die pad; and
    at least one connection bar extending parallel to one of said at least two opposing sides of the die pad, wherein the distal ends of the plurality of lead fingers on said one of said at least two opposing sides of the die pad are connected to the connection bar, wherein the at least one connection bar has first portions where the plurality of lead fingers are connected thereto and second portions between adjacent lead finger connections to the connection bar, and
    wherein the respective second portions comprise a bar that extends diagonally from a first one of the adjacent lead fingers connected thereto to a second one of the adjacent lead fingers connected thereto.

2. The lead frame of claim 1, wherein the diagonal bar of the second portion has a thickness equal to a thickness of each of the plurality of lead fingers.

3. The lead frame of claim 2, wherein the second portions further comprise a non-etched portion that connects the adjacent lead fingers, wherein the non-etched portion has a thickness that is less than a thickness of each of the plurality of lead fingers.

4. The lead frame of claim 3, wherein a thickness of the non-etched portion is about one-half of the thickness of any one of the lead plurality of fingers.

5. The lead frame of claim 3, wherein each of the first portions of the connection bars includes a cavity that extends across the first portion thereof and into the distal end of the lead finger connected thereto.

6. The lead frame of claim 5, wherein the cavity has a depth that is less than about one-half of a thickness of any one of the plurality of lead fingers.

7. The lead frame of claim 1, wherein the first portions of the connection bars include a cavity that extends across the first portion thereof and into the distal end of the lead finger connected thereto.

8. The lead frame of claim 1, wherein the die pad is generally rectangular.

9. The lead frame of claim 1, wherein the die pad, the plurality of lead fingers and the connection bars comprise copper.

10. The lead frame of claim 9, wherein the plurality of lead fingers are plated with a metal or metal alloy.

11. The lead frame of claim 10, wherein the plating comprises Nickel and Palladium.

12. A lead frame strip comprising a plurality of lead frames arranged in an array, wherein each lead frame comprises:
    a die pad for receiving an integrated circuit (IC) die;
    a plurality of lead fingers disposed along at least two opposing sides of the die pad, wherein each of the plurality of lead fingers has a proximal end near to the die pad and a distal end farther from the die pad, and wherein the plurality of lead fingers are perpendicular to the two opposing sides of the die pad; and
    at least one connection bar extending parallel to one of said at least two opposing sides of the die pad, wherein the distal ends of the plurality of lead fingers on said one of said at least two opposing sides of the die pad are connected to the connection bar, wherein the at least one connection bar has first portions where the plurality of lead fingers are connected thereto and second portions between adjacent lead finger connections to the connection bar,
    wherein the respective second portions comprise a bar that extends diagonally from a first one of the adjacent lead fingers connected thereto to a second one of the adjacent lead fingers connected thereto, and
    wherein adjacent lead frames share the connection bar located therebetween.

13. The lead frame of claim 12, wherein the diagonal bar of the second portion has a thickness equal to a thickness of any one of the lead fingers of the plurality of lead fingers.

14. The lead frame of claim 13, wherein the second portions further comprise a non-etched portion that connects the adjacent lead fingers, wherein the non-etched portion has a thickness that is less than a thickness of any one of the lead fingers of the plurality of lead fingers.

15. The lead frame of claim 14, wherein a thickness of the non-etched portion is about one-half of the thickness of any one of the lead fingers of the plurality of lead fingers.

16. The lead frame of claim 14, wherein each of the first portions of the connection bars includes a cavity that extends across the first portion thereof and into the distal end of the lead finger connected thereto.

17. The lead frame of claim 16, wherein the cavity has a depth that is less than about one-half of a thickness of any one of the lead fingers of the plurality of lead fingers.

18. The lead frame of claim 12, wherein the first portions of the connection bars include a cavity that extends across the first portion thereof and into the distal end of the lead finger connected thereto.

* * * * *